United States Patent
Cao et al.

[11] Patent Number: 6,016,011
[45] Date of Patent: Jan. 18, 2000

[54] METHOD AND APPARATUS FOR A DUAL-INLAID DAMASCENE CONTACT TO SENSOR

[75] Inventors: Min Cao; Jeremy A Theil; Gary W Ray, all of Mountain View; Dietrich W Vook, Menlo Park, all of Calif.

[73] Assignee: Hewlett-Packard Company, Palo Alto, Calif.

[21] Appl. No.: 09/300,812

[22] Filed: Apr. 27, 1999

[51] Int. Cl.[7] ............ H01L 23/48; H01L 23/52; H01L 29/40
[52] U.S. Cl. ............ 257/773; 257/750; 257/758; 257/774
[58] Field of Search .................. 257/773, 750, 257/758, 774; 438/622–626, 629

[56] References Cited

U.S. PATENT DOCUMENTS

| | | | |
|---|---|---|---|
| 5,266,446 | 11/1993 | Chang et al. | 430/314 |
| 5,327,011 | 7/1994 | Iwamatsu | 257/750 |
| 5,466,636 | 11/1995 | Cronin et al. | 438/622 |
| 5,602,053 | 2/1997 | Zheng et al. | 437/60 |
| 5,604,156 | 2/1997 | Chung et al. | 438/636 |
| 5,614,765 | 3/1997 | Avanzino et al. | 257/774 |
| 5,635,423 | 6/1997 | Huang et al. | 438/626 |
| 5,663,102 | 9/1997 | Park | 438/626 |
| 5,686,354 | 11/1997 | Avanzino et al. | 437/190 |
| 5,691,238 | 11/1997 | Avanzino et al. | 437/195 |
| 5,693,563 | 12/1997 | Teong | 437/190 |
| 5,702,982 | 12/1997 | Lee et al. | 438/636 |
| 5,729,056 | 3/1998 | Sung | 257/774 |
| 5,736,457 | 4/1998 | Zhao | 438/624 |
| 5,741,626 | 4/1998 | Jain et al. | 438/636 |
| 5,744,376 | 4/1998 | Chan et al. | 437/190 |
| 5,939,788 | 8/1999 | McTeer | 257/751 |

*Primary Examiner*—Mahshid Saadat
*Assistant Examiner*—Jhihan B. Clark
*Attorney, Agent, or Firm*—Trueman H. Denny III

[57] ABSTRACT

A dual-inlaid damascene contact having a polished surface for directly communicating an electrically conductive layer to a semiconductor layer. A dielectric layer is formed on the electrically conductive layer. A dual-inlaid cavity is formed by etching a via cavity and a contact cavity into the dielectric layer. A damascene contact is formed by depositing tungsten into the dual-inlaid cavity. Chemical-mechanical polishing is used to planarize and smooth a surface of the damascene contact until the surface is coplanar with the dielectric layer. A semiconductor layer is then deposited on the damascene contact. The semiconductor layer can be the node of an amorphous silicon P-I-N photodiode. Electrical interconnection between the node of the photodiode and the electrically conductive layer is accomplished without using an intermediate electrode, and the smooth damascene contact improves surface adhesion, reduces contact resistance, and provides a discrete connection to the semiconductor layer. The damascene contact may be polished to provide a light reflective surface finish for reflecting light incident on the damascene contact back into the semiconductor layer to improve the quantum efficiency of the P-I-N photodiode.

12 Claims, 5 Drawing Sheets

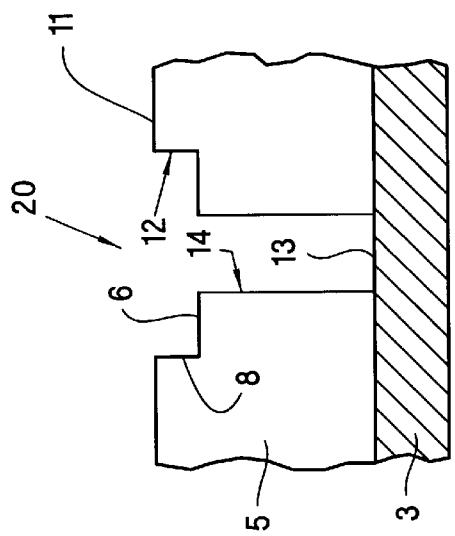
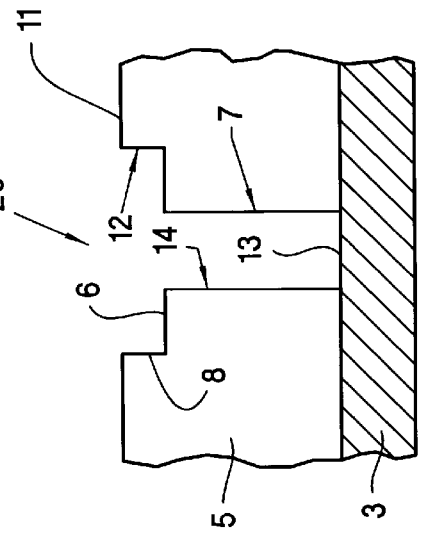
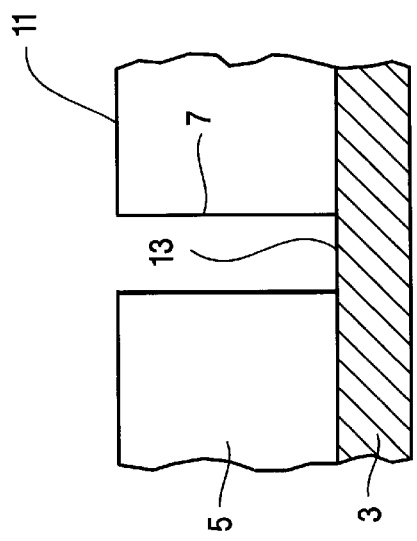
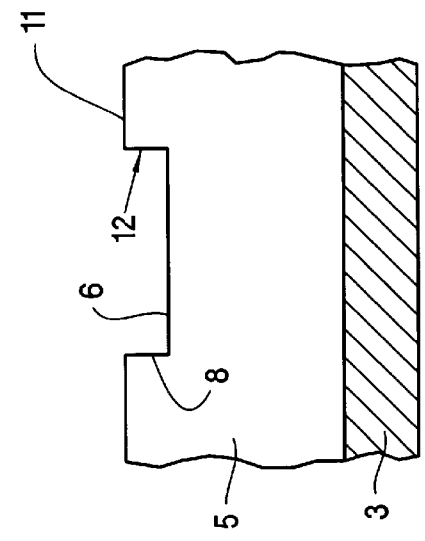
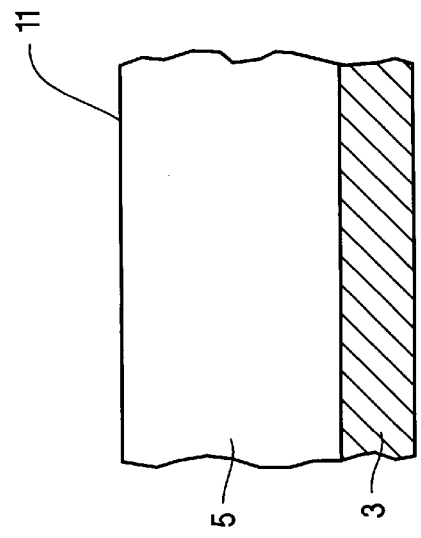
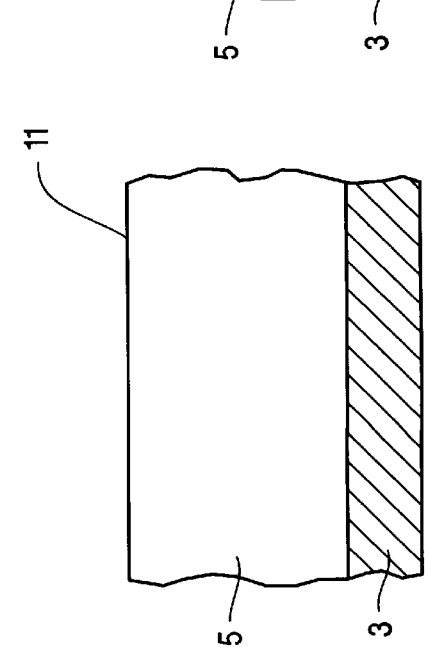

METHOD AND APPARATUS FOR A DUAL-INLAID DAMASCENE CONTACT TO SENSOR

BACKGROUND OF THE INVENTION

The present invention relates generally to a semiconductor interconnect structure and particularly to a semiconductor interconnect structure for communicating a signal between an electrically conductive layer and a semiconductor layer of a sensor.

As feature sizes of integrated circuits continue to decrease it is desirable to minimize the number of processing steps required to fabricate an integrated circuit (IC) in order to increase the number of good integrated circuit die per semiconductor wafer (yield). It is clearly understood in the semiconductor processing art that each processing step has the potential to introduce micro contamination and processing defects that can result in a defective semiconductor and a subsequent reduction in yield per wafer. Additionally, defects introduced during the fabrication process may not surface until the IC becomes part of a finished product that later fails due to the defect in the IC.

Furthermore, it is desirable to simplify IC topography by making layers of the IC planar for the following reasons. First, reliability can be improved by eliminating IC features that have raised portions, abrupt edges, or sharp feature edges, such as conductive electrodes on which a semiconductor layer will be deposited, for example. Those features can introduce step coverage defects at the feature edges such as voids, pinholes, and the like.

Second, when possible, it is desirable to interface one layer of an IC to another layer using a planar surface to eliminate step coverage problems and to eliminate additional processing steps to planarize the layer for a subsequent process step such as a deposition step, for example. A planar surface can also increase adhesion between a contact and a semiconductor layer deposited on the contact. Adhesion can be enhanced by polishing a surface of the contact until the surface is smooth, for example.

Third, interconnect structures that interface different levels of an IC can introduce contact resistance due to various materials and interfaces in the interconnect structure. The contact resistance between a contact and a semiconductor layer can be reduced by eliminating unnecessary intervening structure. Ideally, the contact resistance is reduced to a minimum by making as direct a connection as possible between the contact and the semiconductor layer. Additional benefits from reducing the contact resistance include lower electromigration and reduced power consumption. As circuit feature sizes continue to decrease, lower contact resistance plays an important role in overall IC costs because the cost of packaging is directly related to the amount of waste heat that must be removed from the IC.

Fourth, by eliminating unnecessary topography in a interconnect structure the number of process steps is reduced thereby lowering manufacturing cost, increasing yield, and improving reliability. Fifth, polishing the surface of the contact can produce a mirror like finish that can be used to reflect light incident on the surface back into a semiconductor layer deposited over the contact. If the semiconductor layer is portion of an image sensor such as an amorphous silicon P-I-N photodiode, for example, the reflected light can increase the quantum efficiency of the image sensor.

Topography of prior art interconnect structures includes damascene contacts with two or more barrier layers, vertically stacked damascene contacts, and damascene contacts with integral etch stops.

The two barrier layer damascene contact consists of a first dielectric layer deposited on a semiconductor substrate. A trench is formed in the dielectric layer and a first barrier layer is conformally deposited on sidewall and bottom surfaces of the trench followed by a deposition of a conductive layer such as copper on top of the first barrier layer. The conductive layer is then etched until it is coplanar with a surface of the first dielectric layer. A second barrier layer is then deposited on the surface of the first dielectric layer. The second barrier layer completely covers the conductor. A second dielectric layer is then deposited on top of the second barrier layer. The second dielectric is patterned and then etched down through the second barrier layer to the conductive layer thereby exposing the planar surface of the conductive layer. When copper is used as the conductor the two barrier layers operate to prevent out-diffusion of the copper into the surrounding dielectric layer. The disadvantage of this structure is that the second barrier layer and the second dielectric layer require additional deposition, patterning, and etching steps. The resulting structure is not suitable for making a connection between a conductive layer and a semiconductor layer because the planar conductor surface is positioned at the bottom of a trench created by the second dielectric layer thereby requiring the semiconductor layer to fill the trench in order to make contact with the conductive layer.

Vertically stacked damascene contacts are similar to the foregoing except that a first damascene contact is formed in a first dielectric layer and a second dielectric layer is formed on top of the first dielectric layer, completely covering the first damascene contact. A second damascene contact is formed in the second dielectric layer in alignment with the first damascene contact. Each damascene contact has two barrier layers, and an additional barrier layer is positioned between the contacts. Vertically stacked damascene contacts are structurally more complex and therefore require even more processing steps than a single damascene contact with a resulting decrease in IC yield.

A damascene contact with an integral etch stop is formed by depositing a dielectric layer over a conductive layer and then patterning and etching a trench in the dielectric layer. The trench does not extend to the conductive layer. A conformal etch barrier material is deposited on an upper surface of the dielectric layer, sidewall surfaces of the trench, and a bottom surface of the trench. A pattern for a via opening is aligned with the sidewall surfaces of the trench and then patterned on the bottom surface of the trench. The via opening is then etched to form a via that extends from the bottom surface to the conductive layer. The etching does not remove the barrier material on the sidewall surfaces. The resulting via is narrower than the trench. The trench and the via are then completely filled with a conductive material, followed by polishing the conductive material to form a damascene contact. The disadvantage of using an etch stop is that the via opening must be perfectly aligned with the trench and etch selectivity of the etch barrier material must be selected to prevent etching of the sidewall barrier material during the via etch step. A potential defect can be introduced if the etch barrier is breached during the etch step. The extra steps of depositing, patterning, and etching the barrier material add to the process complexity and therefore have a direct impact on yield. Another disadvantage of using an etch barrier is that after the etch step the etch barrier serves no functional purpose in the damascene contact.

An additional disadvantage of the aforementioned trench structure for a damascene contact is the trench is not suitable for making a direct and discrete connection to a semiconductor layer such as a node of a discrete image sensor. In an image sensor having from several thousand to over a million image pixels it is desirable to make an efficient, direct, and discrete connection to an individual pixel in the image sensor using a discrete damascene contact.

From the foregoing it will be apparent that desirable attributes for a damascene contact to sensor include reducing the number of process steps required to fabricate the damascene contact, increased quantum efficiency, a planar topography, increased surface adhesion, reduced contact resistance, and direct and discrete connection to a semiconductor layer of a sensor.

SUMMARY OF THE INVENTION

The present invention provides an interconnect structure for communicating a signal between an electrically conductive layer and a semiconductor layer. The interconnect structure includes a semiconductor substrate having an electrically conductive layer disposed on the substrate. A dielectric layer is deposited on the substrate, covering the electrically conductive layer. A contact cavity having an opening on a surface of the dielectric extends partially into the dielectric layer. A via cavity, in communication with the contact cavity, extends from a bottom surface of the contact cavity to the electrically conductive layer. An exposed surface of the electrically conductive layer adjacent to the via cavity defines a via surface. The contact cavity and the via cavity form a dual-inlaid cavity. A conductive material is deposited in the dual-inlaid cavity to form a damascene contact. A portion of the conductive material adjacent to the surface of the dielectric layer is polished to form a smooth contact surface. A semiconductor layer is deposited on the surface and covers at least a portion of the contact surface of the damascene contact. The semiconductor layer can also cover the entire contact surface. The damascene contact is in electrical communication with the semiconductor layer and the electrically conductive layer.

The dual-inlaid damascene contact of the present invention reduces the number of process step necessary to form the damascene contact, can be made without the use of barrier materials, can improve quantum efficiency, eliminates the need for an interface conductor, can be formed without an etch stop, has low contact resistance and improved surface adhesion, and makes a direct connection between the electrically conductive layer and the semiconductor layer.

In another embodiment the dual-inlaid cavity is conformally covered by an intermediate layer deposited in the dual-inlaid cavity. The intermediate layer can be used as an out-diffusion barrier, as an adhesion layer, or both. After the intermediate layer is deposited the damascene contact is formed by depositing the conductive material into the dual-inlaid cavity. In another embodiment the semiconductor layer can be a node of a image sensor such as a P-I-N photodiode, for example.

In another embodiment the dielectric layer is formed of a first dielectric layer deposited on the substrate and covering the electrically conductive layer and a second dielectric layer deposited on the first dielectric layer. The second dielectric layer is patterned and then etched to form the contact cavity. The first dielectric layer is then patterned and etched to form the via cavity.

In another embodiment the dielectric layer is formed of a first dielectric layer deposited on the substrate and covering the electrically conductive layer, a second dielectric layer deposited on the first dielectric layer, and a third dielectric layer deposited on the second dielectric layer. The third dielectric layer is patterned and etched to form the contact cavity. The second dielectric layer serves as an etch stop for the contact cavity. The second dielectric is then patterned and etched to form the via cavity which extends through the second and the first dielectric layers.

BRIEF DESCRIPTION OF THE DRAWINGS

FIGS. 4(a) through 4(c) illustrate a cross-sectional view of an interconnect structure having a dual-inlaid cavity wherein the via cavity is formed before the contact cavity is formed.

FIGS. 5(a) through 5(c) illustrate a cross-sectional view of an interconnect structure having a dual-inlaid cavity wherein the contact cavity is formed before the via cavity is formed.

DETAILED DESCRIPTION

Figure 1:
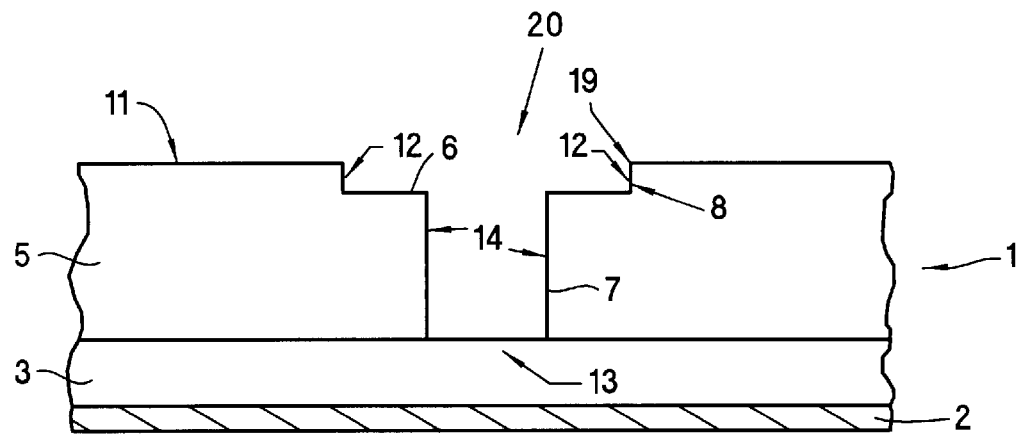
FIGS. 1 through 3 are cross-sectional views showing successive steps in making an interconnect structure according to the present invention.

In the following detailed description and in the several figures of the drawings, like elements are identified with like reference numbers.

As shown in the drawings for purposes of illustration, the invention is embodied in an interconnect structure for communicating a signal between an electrically conductive layer and a semiconductor layer. The interconnect structure includes a semiconductor substrate having an electrically conductive layer. A dielectric layer is deposited on the substrate and covers the electrically conductive layer. A dual-inlaid cavity comprising a contact cavity and a via cavity is formed in the dielectric layer. A conductive material is deposited in the dual-inlaid cavity to form a damascene contact. A portion of the conductive material adjacent to the surface of the dielectric layer is polished to form a smooth contact surface. A semiconductor layer is deposited on the surface and covers at least a portion of the contact surface of the damascene contact. The semiconductor layer can also cover the entire contact surface. The damascene contact is in electrical communication with the semiconductor layer and the electrically conductive layer.

The interconnect structure of the present invention makes a direct connection to the semiconductor layer thereby increasing reliability and decreasing contact resistance, can be polished to reflect incident light back into the semiconductor layer, has a smooth surface that promotes surface adhesion of the semiconductor layer and minimizes step coverage defects due to non-planar topography, and increases IC yield by reducing the number of processing steps required to fabricate the interconnect structure.

Referring to FIG. 1, there is provided in accordance with the present invention an interconnect structure generally designated as 1. The interconnect structure 1 includes an electrically conductive layer 3 deposited on a semiconductor substrate 2. The electrically conductive layer 3 can be a material such as aluminum, tungsten, or copper, for example. The semiconductor substrate 2 can be a material such as silicon, germanium, or gallium arsenide, for example. Methods such as sputtering or chemical vapor deposition (CVD), for example, can be used to deposit the electrically conductive layer 3 on the semiconductor substrate 2.

A dielectric layer 5 is formed by depositing an insulating material on the semiconductor substrate 2. The dielectric layer 5 completely covers the electrically conductive layer 3. A material such as silicon dioxide, for example, can be used for the dielectric layer 5. Using a photo resist mask or other suitable method (not shown) a surface 11 of the dielectric layer 5 is etched to form a contact cavity 8 having an opening 19 adjacent to the surface 11. The contact cavity 8 has first sidewall surfaces 12 and a bottom surface 6. The contact cavity 8 is a shallow cavity that extends into but not through the dielectric layer 5. Using a second photo resist mask or other suitable method (not shown) the bottom surface 6 is etched to form a via cavity 7. The via cavity 7 is positioned within the contact cavity 8 and includes second sidewall surfaces 14 that extend from the bottom surface 6 to the electrically conductive layer 3. An exposed portion of the electrically conductive layer 3 adjacent to the via cavity 7 defines a via surface 13. Together, the contact cavity 8 and the via cavity 7 form a dual-inlaid cavity 20.

For purposes of illustration, the first sidewall surfaces 12 and the second sidewall surfaces 14 are shown substantially vertical; however, the first sidewall surfaces 12 and the second sidewall surfaces 14 need not be vertical, and can be sloped, for example.

In one embodiment of the present invention the material for the electrically conductive layer 3 is aluminum. In another embodiment, the material for the electrically conductive layer 3 is an aluminum copper alloy containing about 1.5% copper.

Figure 2:
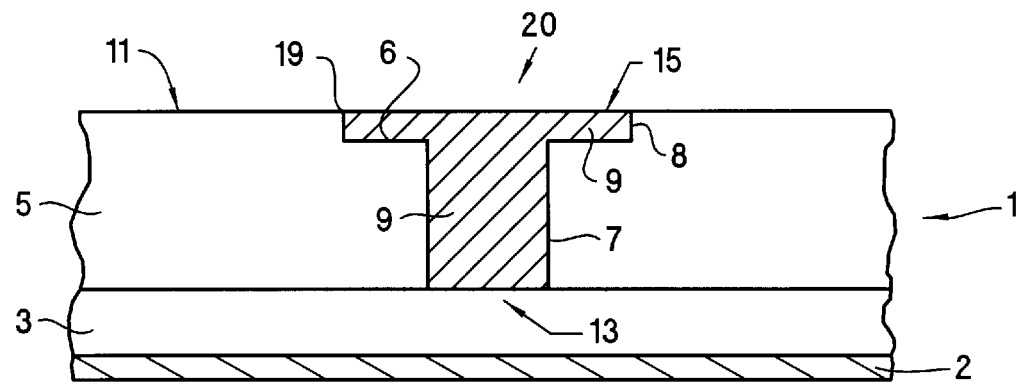

A damascene contact 9 is formed by depositing an electrically conductive material into the dual-inlaid cavity 20 as shown in FIG. 2. The damascene contact 9 completely fills the via cavity 7 and the contact cavity 8. The damascene contact 9 is in electrical communication with the electrically conductive layer 3 and extends from the via surface 13 to a contact surface 15 adjacent to the opening 19. The damascene contact 9 can be made from a material such as tungsten, aluminum, or copper, for example. Suitable methods for depositing the damascene contact 9 include evaporation, physical vapor deposition (PVD), and chemical vapor deposition (CVD).

In one embodiment of the present invention, the contact surface 15 is polished and planarized by removing material from the damascene contact 9 until the contact surface 15 is coplanar with the surface 11 of the dielectric layer 5. A technique such as chemical-mechanical polishing (CMP), for example, can be used to planarize and polish the contact surface 15. After planarization of the damascene contact 9, the contact surface 15 should be smooth and substantially coplanar with the surface 11.

Figure 3:
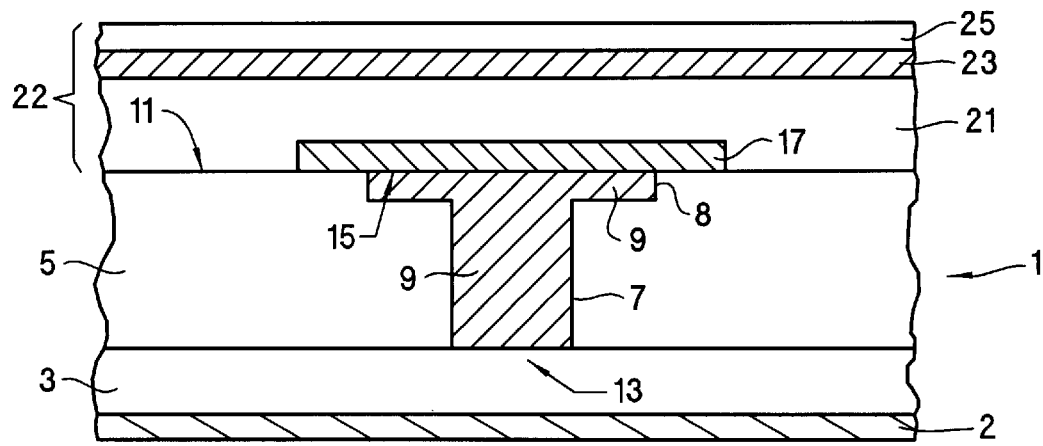

A semiconductor layer 17 is then deposited on the dielectric layer 5 as illustrated in FIG. 3. The semiconductor layer 17 covers at least a portion of the contact surface 15. The semiconductor layer 17 can also cover the entire contact surface 15. The damascene contact 9 is in electrical communication with the semiconductor layer 17. Direct connection of the contact surface 15 to the semiconductor layer 17 reduces contact resistance between the damascene contact 9 and the semiconductor layer 17. The polished contact surface 15 improves surface adhesion between the damascene contact 9 and the semiconductor layer 17. Defects due to step coverage are eliminated because the contact surface is coplanar with the dielectric layer 5 so that the semiconductor layer 17 is deposited on a substantially planar surface.

In one embodiment of the present invention, the semiconductor layer 17 can be a semiconductor material such as amorphous silicon, microcrystalline silicon, silicon carbide, amorphous germanium, and amorphous silicon germanium, for example.

In another embodiment of the present invention, as illustrated in FIG. 3, the semiconductor layer 17 is a first doped layer of amorphous silicon and forms a node of an amorphous silicon P-I-N photodiode 22. An intrinsic amorphous silicon layer 21 is deposited on the semiconductor layer 17. A second doped layer of amorphous silicon 23 is deposited on the intrinsic amorphous silicon layer 21. An optically transparent electrode 25 is deposited on the second dope layer 23 to complete the P-I-N photodiode 22. The optically transparent electrode 25 communicates a bias voltage to the second doped layer 23. The damascene contact 9 electrically communicates the node of the photodiode 22 with the electrically conductive layer 3. The optically transparent electrode 25 can be a material such as indium tin oxide (ITO), for example. Alternatively, the first doped layer of the P-I-N photodiode 22 can be N-type amorphous silicon and the second doped layer 23 can be P-type amorphous silicon, for example.

In another embodiment of the present invention, the first doped layer of the P-I-N photodiode 22 can be P-type amorphous silicon and the second doped layer 23 can be N-type amorphous silicon, for example.

In one embodiment of the present invention, prior to the semiconductor layer 17 being deposited, the planarization of the contact surface 15 includes polishing the contact surface 15 until it has a mirror-like surface finish so that light incident on the contact surface 15 is reflected back into the semiconductor layer 17. The reflected light can be used to increase the quantum efficiency of an image sensor such as the P-I-N photodiode 22, for example. Alternatively, the surface finish need not be mirror-like; however, the surface finish should be such that the desired wavelengths of light are reflected back into the semiconductor layer 17.

In one embodiment of the present invention, as shown in FIGS. 4a through 4c, the dual-inlaid cavity 20 can be formed by using a photo resist mask (not shown) to etch the surface 11 of the dielectric layer 5 to form the via cavity 7. The via cavity 7 extends from the surface 11 to the electrically conductive layer 3, as shown in FIG. 4b. Using a photo resist mask (not shown) the surface 11 is then etched to form the contact cavity 8. The bottom 6 of the contact cavity 8 is positioned intermediate between the surface 11 and the via surface 13, as shown in FIG. 4c.

In another embodiment of the present invention, as shown in FIGS. 5a through 5c, the dual-inlaid cavity 20 can be formed by using a photo resist mask (not shown) to etch the surface 11 of the dielectric layer 5 to form the contact cavity 8. The bottom surface 6 of the contact cavity 8 is positioned intermediate between the surface 11 and the electrically conductive layer 3, as shown in FIG. 5b. Using a photo resist mask (not shown) the bottom 6 is then etched to form the via cavity 7. The via cavity 7 extends from the bottom 6 to the electrically conductive layer 3, as shown in FIG. 5c.

Figure 6A:
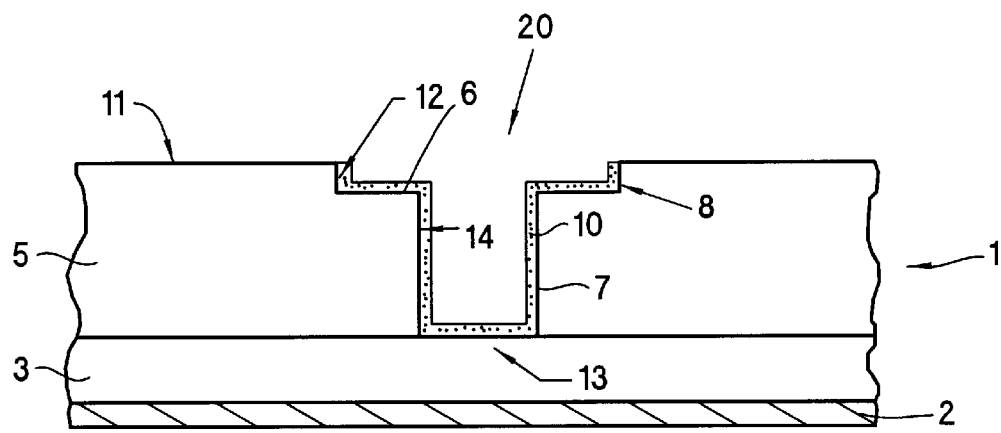
FIGS. 6(a) through 6(c) are cross-sectional views showing successive steps in making interconnect structure having an intermediate layer deposited therein.

In one embodiment of the present invention, as shown in FIG. 6a, an intermediate layer 10 is conformally deposited on the first sidewall surfaces 12, the bottom surface 6 of the contact cavity 8, the second sidewall surfaces 14, and the via surface 13 of the via cavity 7. The intermediate layer 10 can be used as a barrier to prevent out-diffusion of the material used for the damascene contact 9 into the surrounding dielectric layer 5. Additionally, the intermediate layer 10 can be used as an adhesion layer to enhance bonding between the dual-inlaid cavity 20 and the material used for the damascene contact 9.

Figure 6B:
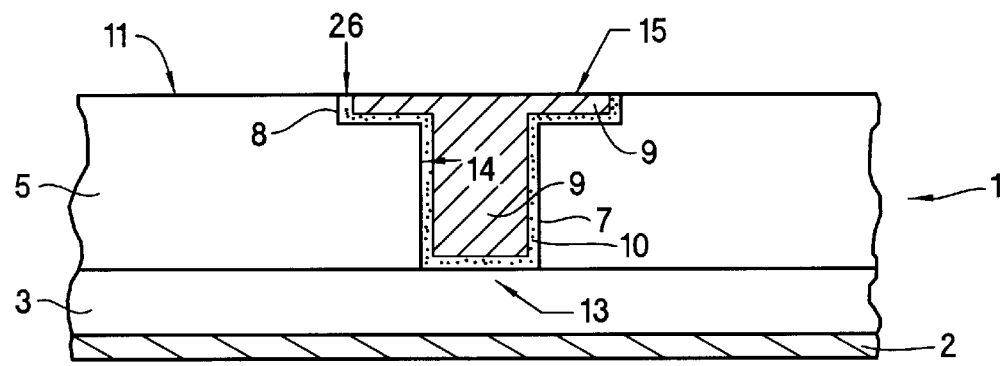
Figure 6C:
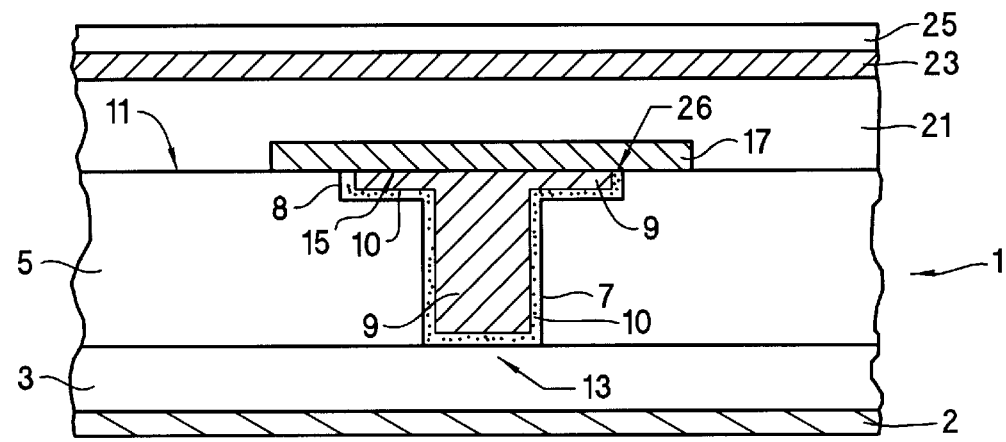

After depositing the intermediate layer 10, the damascene contact 9 is deposited in the dual-inlaid cavity 20. The intermediate layer 10 is positioned between the damascene contact 9 and the dielectric layer 5 and operates to prevent out-diffusion or to enhance adhesion as mentioned above. The contact surface 15 is then polished as described above resulting in a substantially coplanar and smooth damascene contact 9 as shown in FIG. 6b. The polish step results in an upper edge portion 26 of the intermediate layer 10 being made coplanar with the surface 11. The semiconductor layer 17 is then deposited on the surface 11 and covers at least a portion of the contact surface 15 and the edge portion 26, as shown in FIG. 6c. The semiconductor layer 17 can also cover the entire contact surface 15.

In one embodiment of the present invention, the intermediate layer 10 can be a barrier material such as titanium, titanium nitride, titanium tungsten, and tantalum nitride, for example.

Figure 7A:
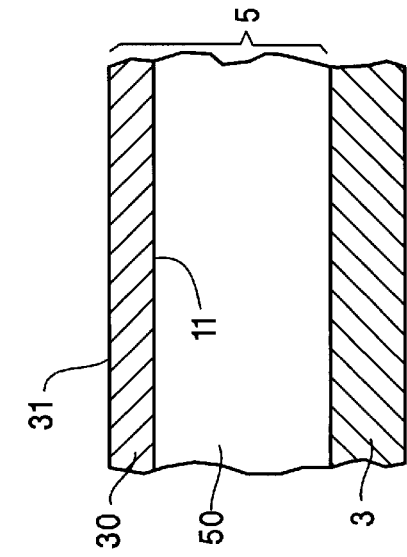
FIGS. 7(a) through 7(c) are cross-sectional views of an interconnect structure showing a dielectric layer formed of first and second dielectric layers having a dual-inlaid cavity formed therein.
Figure 7B:
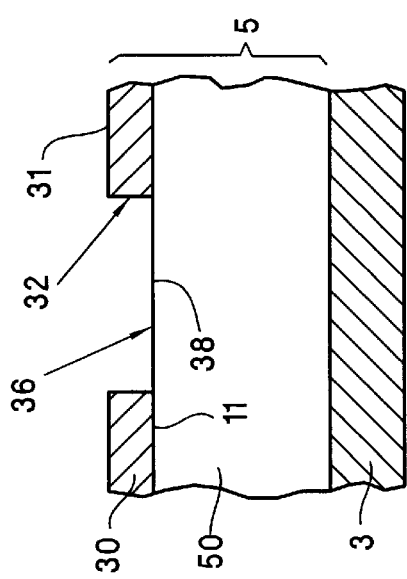

In another embodiment of the present invention, as illustrated in FIG. 7a, the dielectric layer 5 includes a first dielectric layer 50 and a second dielectric layer 30 disposed on a surface 11 of the first dielectric layer 50. The first dielectric layer 50 is disposed on the semiconductor substrate 2 (not shown) and completely covers the electrically conductive layer 3. The first dielectric layer 50 can be silicon dioxide and the second dielectric layer 30 can be nitride, for example. Using a photo resist mask (not shown) an upper surface 31 of the second dielectric layer 30 is etched to form a contact cavity 38. The first dielectric layer 50 serves as an etch stop such that a bottom surface 36 of the contact cavity 38 is positioned adjacent to the surface 11 after the etch step, as illustrated in FIG. 7b.

Figure 7C:
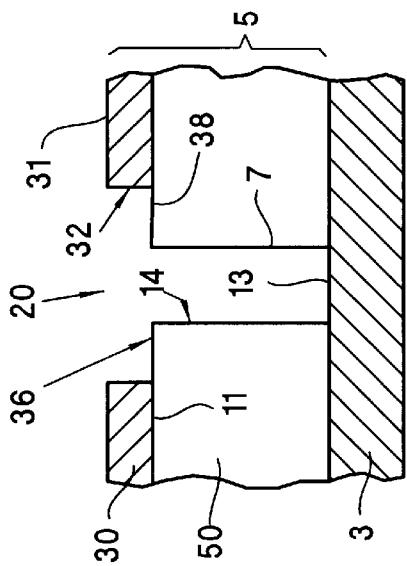

The contact cavity 38 has first sidewall surfaces 32. The first sidewall surfaces 32 need not be vertical or perpendicular to the bottom surface 36. Using a second photo resist mask (not shown) the bottom surface 36 is etched to form a via cavity 7. The via cavity 7 is positioned within the contact cavity 38 and has second sidewall surfaces 14, as illustrated in FIG. 7c. The second sidewall surfaces 14 extend from the bottom surface 36 of the contact cavity 38 to the electrically conductive layer 3. An exposed portion of the electrically conductive layer 3 adjacent to the via cavity 7 defines a via surface 13. A dual-inlaid cavity 20 is formed by the contact cavity 38 and the via cavity 7. In the manner described above in reference to FIG. 2, the damascene contact 9 (not shown) is formed by depositing an electrically conductive material into the dual-inlaid cavity 20. The contact surface 15 (not shown) is adjacent to the upper surface 31. The semi conductor layer 17 (not shown) can be deposited on the contact surface 15 as described above in reference to FIG. 3. Additionally, the intermediate layer 10 (not shown) as described above in reference to FIGS. 6(a) through 6(c) can be deposited in the dual-inlaid cavity 20.

Figure 8A:
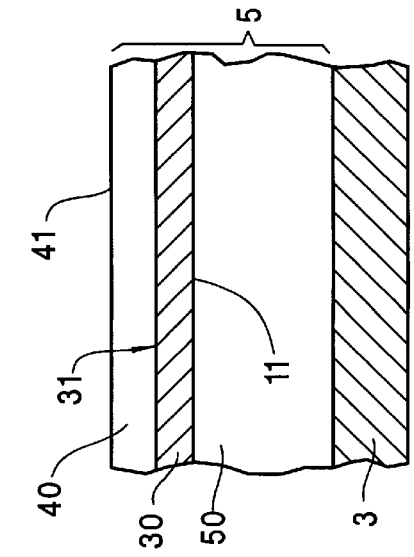
FIGS. 8(a) through 8(c) are cross-sectional views of an interconnect structure showing a dielectric layer formed of first, second, and third dielectric layers having a dual-inlaid cavity formed therein.

In another embodiment of the present invention, as illustrated in FIG. 8a, the dielectric layer 5 includes a first dielectric layer 50, a second dielectric layer 30 disposed on a surface 11 of the first dielectric layer 50, and a third dielectric layer 40 disposed on a surface 31 of the second dielectric layer 30. The first dielectric layer 50 is disposed on the semiconductor substrate 2 (not shown) and completely covers the electrically conductive layer 3. The first dielectric layer 50 can be silicon dioxide, the second dielectric layer 30 can be nitride, and the third dielectric layer 40 can be silicon dioxide, for example. Alternatively, before depositing the second dielectric layer 30, the surface 11 of the dielectric layer 50 can be planarized to form a substantially planar surface on which to deposit the second dielectric layer 30. A polishing method such as chemical mechanical polishing (CMP) may be used to planarize the surface 11, for example.

Figure 8B:
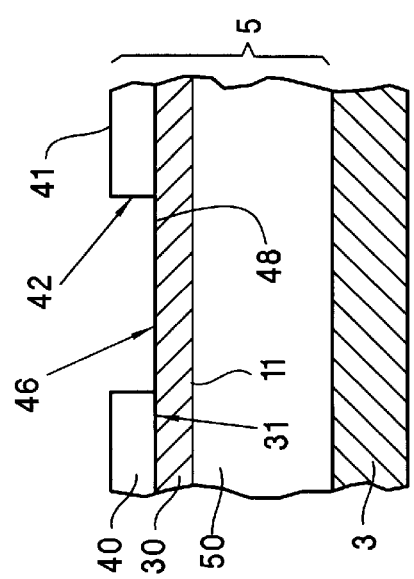

Using a photo resist mask (not shown) an upper surface 41 of the third dielectric layer 40 is etched to form a contact cavity 48. The dielectric layer 30 serves as an etch stop such that a bottom surface 46 of the contact cavity 48 is positioned adjacent to the upper surface 31 after the etch step, as illustrated in FIG. 8b. The contact cavity 48 has first sidewall surfaces 42. The first sidewall surfaces 42 need not be vertical or perpendicular to the bottom surface 46.

Figure 8C:
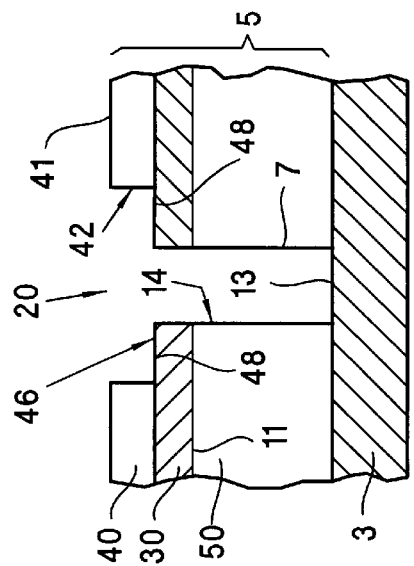

Using a second photo resist mask (not shown) the bottom surface 46 is etched to form a via cavity 7 that extends through the second dielectric layer 30 and the first dielectric layer 50. The via cavity 7 is positioned within the contact cavity 48 and has second sidewall surfaces 14, as illustrated in FIG. 8c. The second sidewall surfaces 14 extend from the bottom surface 46 of the contact cavity 48 to the electrically conductive layer 3. An exposed portion of the electrically conductive layer 3 adjacent to the via cavity 7 defines a via surface 13. A dual-inlaid cavity 20 is formed by the contact cavity 48 and the via cavity 7

In the manner described above in reference to FIG. 2, the damascene contact 9 (not shown) is formed by depositing an electrically conductive material into the dual-inlaid cavity 20. The contact surface 15 (not shown) is adjacent to the upper surface 41. The semi conductor layer 17 (not shown) can be deposited on the contact surface 15 as described above in reference to FIG. 3. Additionally, the intermediate layer 10 (not shown) as described above in reference to FIGS. 6(a) through 6(c) can be deposited in the dual-inlaid cavity 20.

Figure 9A:
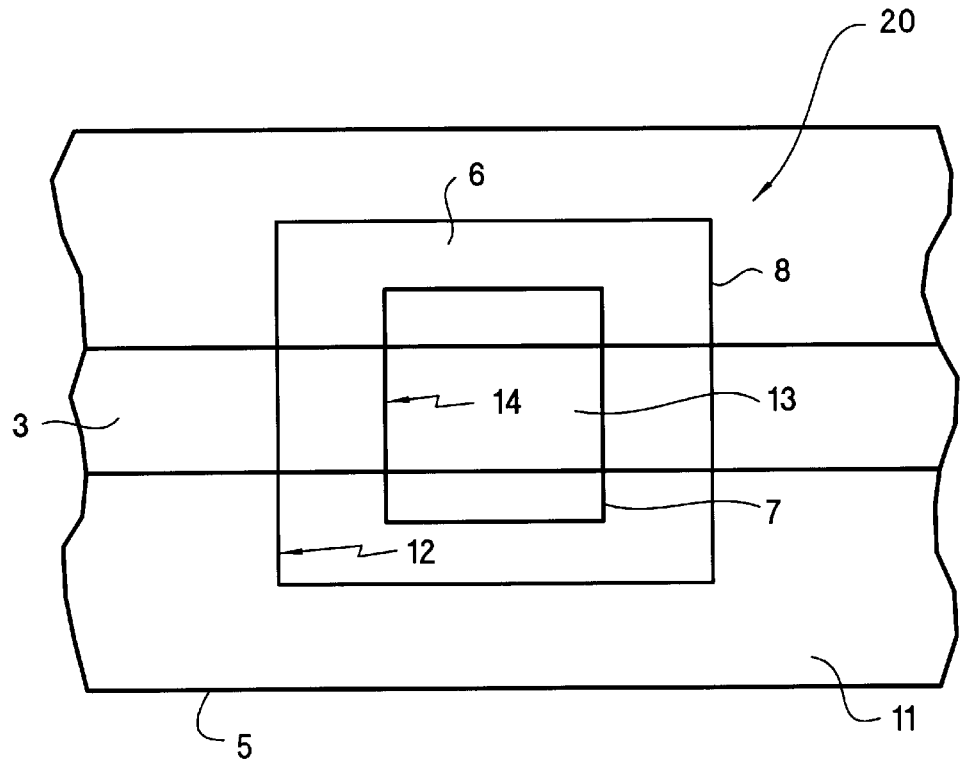
FIGS. 9(a) through 9(b) are top views of an interconnect structure illustrating a polygon and circular shapes respectively for the dual-inlaid cavity.

In a another embodiment of the present invention, as shown in FIG. 9a, the dual-inlaid cavity 20 has a polygon shape. The polygon shape can be a square or a rectangle, for example. The contact cavity 8 and the via cavity 7 are patterned and etched to form polygon shaped cavities in the dielectric layer 5. By using the polygon shape for the dual-inlaid cavity 20 a plurality of discrete damascene contact regions can be formed in the dielectric layer 5 to facilitate electrical interconnection to a plurality of discrete image sensor elements such as P-I-N photodiodes, for example.

Figure 9B:
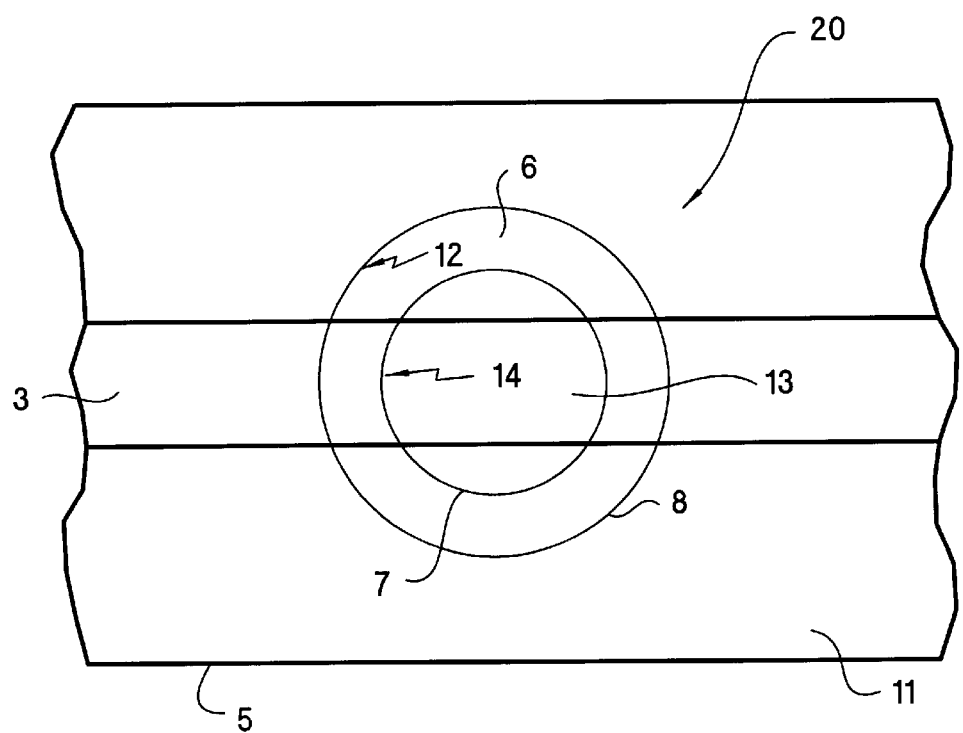

In one embodiment of the present invention, as shown in FIG. 9b, the dual-inlaid cavity 20 has a circular shape defined by patterning and etching a circularly shaped contact cavity 8 and a circularly shaped via cavity 7. Although circular and polygon shapes are shown other shapes may be used for the via cavity 7 and the contact cavity 8. In general it is desirable to use a shape for the dual-inlaid cavity 20 that defines a discrete region for interconnection with the semiconductor layer 17.

Although several embodiments of the present invention have been disclosed and illustrated, the invention is not limited to the specific forms or arrangements of parts so described and illustrated. The invention is only limited by the claims.

What is claimed is:

1. A dual-inlaid damascene contact comprising:
   an electrically conductive layer;
   a dielectric layer formed on the electrically conductive layer, the dielectric layer having a dual-inlaid cavity formed therein, the dual-inlaid cavity comprising a contact cavity formed in a portion of the dielectric layer, the contact cavity having a bottom surface, first sidewall surfaces, and an opening adjacent to a surface of the dielectric layer, and
   a via cavity formed in a portion of the dielectric layer, the via cavity having second sidewall surfaces that extend the contact cavity to the electrically conductive layer, the electrically conductive layer having a via surface defined by an exposed portion of the electrically conductive layer adjacent to the via cavity;
   a damascene contact disposed in the dual-inlaid cavity and in electrical communication with the electrically conductive layer, the damascene contact extending from the via surface to a contact surface adjacent to the opening of the contact cavity; and
   a semiconductor layer formed on the surface of the dielectric layer and positioned over a portion of the contact surface and in electrical communication with the contact surface, whereby the damascene contact forms an interconnect structure between the electrically conductive layer and the semiconductor layer.

2. The dual-inlaid damascene contact of claim 1, wherein the dielectric layer is formed of a first dielectric layer and a second dielectric layer, the contact cavity is formed in the second dielectric layer and the via cavity is formed in the first dielectric layer.

3. The dual-inlaid damascene contact of claim 1, wherein the dielectric layer is formed of a first dielectric layer, a second dielectric layer, and a third dielectric layer, the contact cavity is formed in the third dielectric layer and the via cavity is formed in the second and the first dielectric layers.

4. The dual-inlaid damascene contact of claim 1, wherein the electrically conductive layer comprises a metal selected from the group consisting of tungsten, copper, and aluminum.

5. The dual-inlaid damascene contact of claim 1, wherein the electrically conductive layer comprises an aluminum copper alloy containing about 1.5% copper.

6. The dual-inlaid damascene contact of claim 1, wherein the damascene contact comprises an electrically conductive material selected from the group consisting of tungsten, aluminum, and copper.

7. The dual-inlaid damascene contact of claim 1, wherein the contact surface is polished and is substantially coplanar with the surface of the dielectric layer.

8. The dual-inlaid damascene contact of claim 1, wherein the semiconductor layer is a material selected from the group consisting of amorphous silicon, microcrystalline silicon, silicon carbide, amorphous silicon germanium, and amorphous germanium.

9. The dual-inlaid damascene contact of claim 1 further comprising an intermediate layer disposed on the first sidewall surfaces, the bottom surface, the second sidewall surfaces, and the via surface and positioned between the damascene contact and the dielectric layer.

10. The dual-inlaid damascene contact of claim 7, wherein the contact surface has a surface finish that reflects light.

11. The dual-inlaid damascene contact of claim 8, wherein the semiconductor layer is doped amorphous silicon and the semiconductor layer is a node of an intrinsic amorphous silicon P-I-N Photodiode.

12. The dual-inlaid damascene contact of claim 10, wherein the intermediate layer is selected from the group consisting of titanium, titanium nitride, titanium tungsten, and tantalum nitride.

* * * * *